(12) United States Patent
Ghazinour et al.

(10) Patent No.: US 9,197,158 B2
(45) Date of Patent: Nov. 24, 2015

(54) DYNAMIC FREQUENCY DIVIDER CIRCUIT

(75) Inventors: Akbar Ghazinour, Ottobrunn (DE); Saverio Trotta, Munich (DE)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/394,116

(22) PCT Filed: Apr. 20, 2012

(86) PCT No.: PCT/IB2012/051997
§ 371 (c)(1),
(2), (4) Date: Oct. 13, 2014

(87) PCT Pub. No.: WO2013/156822
PCT Pub. Date: Oct. 24, 2013

(65) Prior Publication Data
US 2015/0077163 A1     Mar. 19, 2015

(51) Int. Cl.
| | |
|---|---|
| *H03B 19/14* | (2006.01) |
| *H03F 3/45* | (2006.01) |
| *H03F 3/60* | (2006.01) |
| *H03K 23/66* | (2006.01) |
| *H03L 7/00* | (2006.01) |

(52) U.S. Cl.
CPC ............ *H03B 19/14* (2013.01); *H03F 3/45085* (2013.01); *H03F 3/60* (2013.01); *H03K 23/667* (2013.01); *H03L 7/00* (2013.01); *H03F 2200/423* (2013.01); *H03F 2203/45702* (2013.01)

(58) Field of Classification Search
CPC ....... H03B 19/14; H03F 3/45085; H03F 3/60; H03F 2200/423; H03F 2203/45702; H03K 23/667; H03L 7/00
See application file for complete search history.

(56) References Cited

U.S. PATENT DOCUMENTS

| | | | |
|---|---|---|---|
| 4,695,940 A | 9/1987 | Rein | |
| 6,285,262 B1 | 9/2001 | Kuriyama | |
| 7,602,221 B2 | 10/2009 | Trotta | |
| 8,198,933 B2 * | 6/2012 | Saverio | ......................... 327/355 |
| 2005/0093587 A1 | 5/2005 | Knapp et al. | |

FOREIGN PATENT DOCUMENTS

WO     2009104055 A1     8/2009

OTHER PUBLICATIONS

Derksen, Rainer H. et al: "7.3-GHz Dynamic Frequency Dividers Monolithically Integrated in a Standard Bipolar Technology", IEEE Transactions on Microwave Theory and Techniques, vol. 36, No. 3, Mar. 1988, pp. 537-541.
Pohl, Nils et al: "SiGe Bipolar VCO With Ultra-Wide Tuning Range at 80 GHz Center Frequency", IEEE Journal of Solid-State Circuits, vol. 44, No. 10, Oct. 2009, pp. 2655-2662.
International Search Report and Written Opinion correlating to PCT/IB2012/051997 dated Dec. 26, 2012.

* cited by examiner

*Primary Examiner* — Patrick O'Neill

(57) ABSTRACT

The invention relates to a Frequency Divider Circuit for dividing an input RF signal to a frequency divided RF signal. The circuit comprises a RF pair, a switching-quad pair coupled in series with a transimpedance amplifier and a double pair of emitter followers. The circuit comprises coupling elements for providing first DC paths to first amplifier paths of the RF pair and for providing second DC paths to second amplifier paths of the series arrangement of the switching-quad pair and the transimpedance amplifier. The first DC paths are independent of the second DC paths. RF connections are provided to couple the first and the second amplifier paths for transferring a signal from the first amplifier paths to the second amplifier paths.

18 Claims, 4 Drawing Sheets

DYNAMIC FREQUENCY DIVIDER CIRCUIT

FIELD OF THE INVENTION

This invention relates to the field of Dynamic Frequency Divider circuits.

BACKGROUND OF THE INVENTION

Dynamic Frequency Dividers (DFD) are critical components of, for example, mm-wave (30-300 GHz) transceivers which are used, for example, in automotive radar systems. Such systems often comprises a chain of frequency dividers. A dynamic frequency divider is usually used as a first stage divider. DFDs are often based on regenerative dividers because of their high frequency performance, such as a high operative frequency and a high bandwidth.

A first example of a DFDs is disclosed in "7.3-GHz Dynamic Frequency Dividers Monolithically Integrated in a Standard Bipolar Technology", by Rainer H. Derksen and Hans-Martin Rein, IEEE Transactions on Microwave Theory and Techniques, Vol. 36, No. 3, p. 537-541, March 1988. A second example of a DFDs for operation in the mm-wave frequency band is disclosed in "SiGe Bipolar VCO With Ultra-Wide Tuning Range at 80 GHz Center Frequency", by Nils Pohl et al., IEEE Journal of Solid-State Circuits, Vol. 44, Issue 10, p. 2655-2662, October 2009.

FIG. 1 schematically presents the topology of the known prior art DFDs 100. A series arrangement of a transimpedance amplifier 102, a switching-quad pairs circuitry 106, and an RF-pair circuitry 110 is coupled in between voltage supply rails V+ and V−. A high frequency input signal 112 is received at input ports of the RF-pair circuitry 100 which amplifies the high frequency input signal 112 and provides an amplified high frequency signal 108 to the switching-quad pairs circuitry 106. The switching-quad pairs circuitry 106 provides a signal 104 which comprises a mixed frequencies signal to the transimpedance amplifier 102 which amplifies the received signal and provides an amplified signal 114 to two stages of emitter followers 118. An output signal 116 of the two stages of emitter followers 118 is fed back to the switching-quad pairs circuitry 106. The output signal 116 comprises a signal with a frequency that is half the frequency of the high frequency input signal 112. The switching-quad pairs circuitry 106 mixes the amplified high frequency signal 108 with the output signal 116 of the two stage of emitter followers 118. The output signal 116 of the two stages of emitter followers 118 is also provided to an output emitter follower circuitry 120 which provides the frequency divided output signal 122. The frequency divided output signal 122 has a frequency that is half the frequency of the high frequency input signal 112. The output emitter follower circuitry 120 and the two stages of emitter followers 118 are coupled between the supply voltage lines V+, V−.

FIG. 2 schematically presents a circuitry 200 of a prior art DFD. Different elements of the circuitry of FIG. 1 are indicated. The high frequency input signal 112 is received from an input amplifier circuitry. The RF-pair circuitry 110 comprises a differential pair of bipolar transistors arranged in common emitter mode, which means that each transistor receives another signal at its base, that the collectors are the output nodes of the RF pair circuitry 110 and that the emitters of the transistors are coupled to each other. The switching-quad pairs circuitry 106 comprises double differential pairs of bipolar transistors and each differential pair is arranged in a common emitter mode. The transistors of the differential pairs are coupled such that, if the bases of two transistors are coupled to the same control signal, the collector is coupled to another output terminal of the switching-quad pair circuitry 106. The combination of the RF-pair circuitry 110 and the switching-quad pairs circuitry 106 forms a Gilbert-Cell which acts as a frequency mixing circuitry. The output signal of switching-quad pairs circuitry 106 is provided to the transimpedance amplifier 102. Together with the two stages of emitter followers 118, the transimpedance amplifier 102 provides a large enough gain for operating the DFD in the mm-wave spectral range. The output emitter follower circuitry 120 acts as an additional buffer for driving further stages circuitries and prevents that the DFD feedback loop is loaded too much by the further stages circuitries.

The functioning of the prior art DFD circuits requires a relatively high voltage supply of at least 5 volts to obtain a high quality DFD for frequencies in the mm-wave band. Further, the output emitter follower circuitry 120 has to work at a relatively high current operating point in order to provide an advantageous high frequency performance. Thus, the known DFD circuit can not be used in low-voltage (for example, 3.3 volts) and low power circuits.

SUMMARY OF THE INVENTION

The present invention provides a dynamic frequency divider circuit, an integrated circuit, a semiconductor device, a mm-wave transceiver and a radar system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Because the apparatus implementing the present invention is, for the most part, composed of electronic components and circuits known to those skilled in the art, circuit details will not be explained in any greater extent than that considered necessary, for the understanding and appreciation of the underlying concepts of the present invention and in order not to obfuscate or distract from the teachings of the present invention.

Figure 3A:
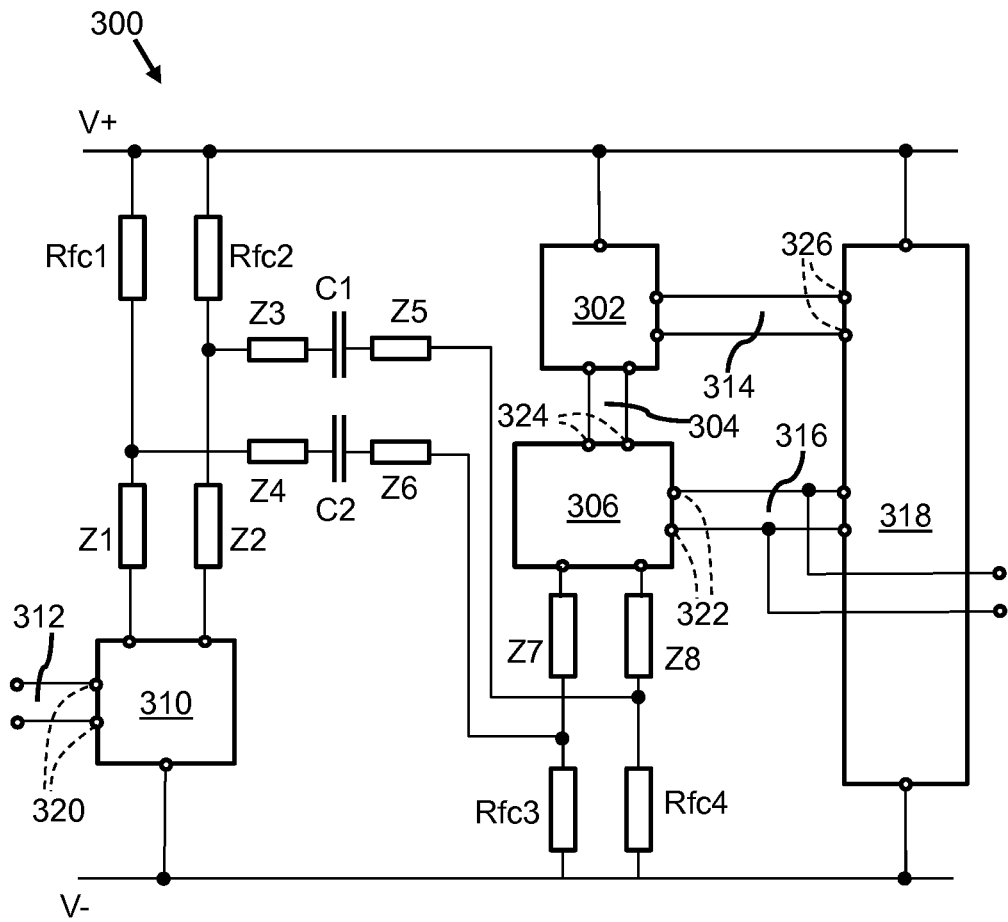
FIG. 3a schematically shows an example of an embodiment of a dynamic frequency divider circuit in accordance with the first aspect of the invention, FIG. 3b schematically shows an example of an embodiment of an RF-pair, FIG. 3c schematically shows an example of an embodiment of a switching-quad pair, FIG. 4 schematically shows an example of a dynamic frequency divider circuit.
Figure 3B:
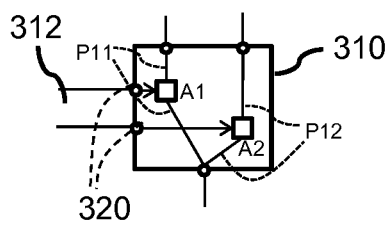

FIG. 3a schematically shows an example of an embodiment of a dynamic frequency divider circuit 300 in accordance with the first aspect of the invention. The circuit 300 has a first voltage supply line V+ and a second voltage supply line V−. The circuit 300 comprises an RF pair 310 which comprises a differential pair of first amplifier elements A1, A2 and comprises first differential control terminals 320 on which the RF pair 310 receives an input RF signal 312. The RF pair 310 is schematically drawn in FIG. 3b. The first amplifier elements A1, A2 are arranged in the first amplifier paths P11, P12. The first amplifier element A1, A2 receive the input RF signal 312 and, as such, the first amplifier paths P11, P12 are responsive to the received input RF signal 312. In the context of this document, an amplifier path is a path of which the conductivity is controlled by applying a current or a voltage to a control terminal of the amplifying element. Thus, for example, amplifying element A1 receives at its control terminal a RF input signal received from one of the first differential control terminals 320, and regulates in accordance with the received signal the conductivity of the amplifier path P11 between its two other terminals. If, for example, the amplifying element A1 is implemented by a transistor, the amplifying path P11 would be connected to the collector and to the emitter of the transistor.

Figure 3C:
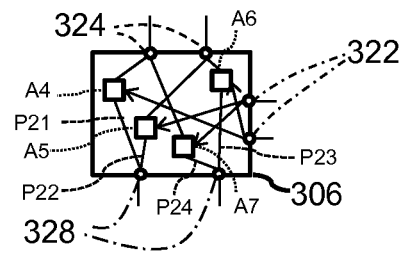

The circuit 300 further comprises a switching-quad pair 306 which is schematically drawn in FIG. 3c. The switching-quad pair 306 comprises a first differential pair of amplifying elements A4, A5 which are arranged in a first pair of second amplifier paths P21, P22. The switching-quad pair 306 comprises a second differential pair of amplifying element A6, A7 which are arranged in a second pair of second amplifier paths P23, P24. The switching-quad pair 306 has differential output terminals 324 which are coupled to the double second amplifier paths. The switching-quad pair 306 has also second amplifier path terminals 328 to which the double second amplifier paths are coupled as well. The differential pairs are arranged in a cross-coupled arrangement, which means that: a first amplifier element A4 of the first pair of amplifying elements A4, A5 is coupled between a first one of the differential output terminals 324 and a first one of the second amplifier path terminals 328; a second amplifier element A5 of the first pair of amplifying elements A4, A5 is coupled between a second one of the differential output terminals 324 and a first one of the second amplifier path terminals 328; a first amplifier element A6 of the second pair of amplifying elements A6, A7 is coupled between the second one of the differential output terminals 324 and the second one of the second amplifier path terminals 328; a second amplifier element A7 of the second pair of amplifying elements A6, A7 is coupled between the first one of the differential output terminals 324 and the second one of the second amplifier path terminals 328. Thus, the first pair of second amplifier paths P21, P22 provide amplifiers path between the differential output terminals 324 and a first one of the second amplifier path terminals 328. The second pair of second amplifier paths P23, P24 provides amplifier paths between the differential output terminals 324 and a second one of the second amplifier path terminals 328. The switching-quad pair 306 further comprises second differential control terminals 322 for receiving a feedback signal 316. The amplifying element A4 is coupled to one of the second differential control terminals 322 and the amplifying element A5 is coupled to another one of the second differential control terminals 322. The amplifying element A6 is coupled to the one of the second differential control terminals 322 and the amplifying element A7 is coupled to the another one of the second differential control terminals 322. Thus, the double second amplifier paths P21 . . . P24 are responsive to the feedback signal 316. Further, amplifying elements A4/A6, A5/A7 which are coupled to the same second differential control terminals 322 are coupled to different differential output terminals 324 and different second amplifier path terminals 328 In the drawn configuration of FIG. 3c, the amplifier paths P22, P24 cross each other. The switching-quad pair 306 mixes the feedback signal 316 received at the second differential control terminals 322 with the signal received at the second amplifier path terminals 328 and provides a mixed signal 304 to the differential output terminals 324.

The circuit 300 further comprises a transimpedance amplifier 302 which receives the mixed signal 304 from the differential output terminals 324 of the switching-quad pair 306 and provides an amplified signal 314 to a subsequent circuit. The transimpedance amplifier 302 has a small input and output impedance and has a constant transfer function over a wideband high frequency range even up to high frequency. The transfer function is expressed as the voltage output with respect to its input current. The transimpedance amplifier 302 is used in the DFD to obtain a high frequency operation in a relatively wide frequency band.

The circuit 300 also comprises a double pair of emitter followers 318 which comprises follower input terminals 326 which receive the amplified signal 314 from the transimpedance amplifier 302. The double pair of emitter followers 318 buffer the amplified signal 314 and provide the feedback signal 316, which is at the same time the output signal of the circuit 300. The frequency of the feedback output signal 316 is equal to the frequency of the input RF signal 312 divided by two.

The RF pair 310 is coupled by means of coupling elements Rfc1, Rfc2, Z1, Z2 in between the DC voltage supply rails V+, V−. The first amplifier paths P11, P12 are coupled to this RF-pair 310 DC path. The series arrangement of the switching-quad pair 306 and the transimpedance amplifier 302 is coupled by means of coupling elements Rfc3, Rfc4, Z7, Z8 in between the DC voltage supply rails V+, V−. The second amplifier paths P21 . . . P24 are coupled to the DC-path of the series arrangement of the switching-quad pair 306 and the transimpedance amplifier 302. The DC-path of the RF pair 310 and of the series arrangement of the switching-quad pair 306 and the transimpedance amplifier 302 are independent of each other. The input RF-signal 312, which is amplified by the RF-pair 310, is transmitted from the first amplifier paths P11, P12 to the double second amplifier paths P21 . . . P24 by means of RF connections which are formed by the RF connection elements C1, C2, Z3, Z4, Z5, Z6. The RF connections do not transmit or transfer the DC-voltage of the DC paths and as such the RF connections contribute to the independence of the parallel DC-paths for the RF-pair 310 and the series arrangement of the switching-quad pair 306 and the transimpedance amplifier 302.

The RF-pair 310 DC-path comprises RF chokes Rfc1, Rfc2 which do not transmit the amplified RF signal, but allow the flow of a DC current through the RF-pair 310 DC-path. In other words, the RF chokes Rfc1, Rfc2 prevent that the amplified input RF signal is provided to one of the DC voltage supply lines V+. The coupling elements of the RF-pair 310 DC-path may further comprise transmission lines Z1, Z2. The RF chokes Rfc1, Rfc2 have a first and second terminal. They are coupled with a first terminal to one of the DC voltage supply lines V+. The transmission lines Z1, Z2 have a first and a second terminal. The first terminals of the transmission lines Z1, Z2 are connected to the second terminals of the RF chokes Rfc1, Rfc2 and the second terminals of the transmission lines Z1, Z2 are connected to the RF-pair 310. The common point between the RF chokes Rfc1, Rfc2 and the transmission lines Z1, Z2 is a point where the RF connections are coupled to the first amplifier paths.

The DC-path of the series arrangement of the switching-quad pair 306 and the transimpedance amplifier 302 comprises RF chokes Rfc3, RFc4 which do not transmit the amplified RF signal, but allow the flow of a DC current through the respective DC-path. In other words, the RF chokes Rfc3, Rfc4 prevent that the amplified input RF signal is provided to one of the DC voltage supply lines V−. The coupling elements of the respective DC-path may further comprise transmission lines Z7, Z8. The RF chokes Rfc3, Rfc4 have a first and second terminal. They are coupled with a first terminal to another one of the DC voltage supply lines V− than the DC voltage supply line V+ to which the RF chokes Rfc1, Rfc2 of the RF pair 310 DC path are coupled. The transmission lines Z7, Z8 have a first and a second terminal. The first terminals of the transmission lines Z7, Z8 are connected to the second terminals of the RF chokes Rfc3, Rfc4 and the second terminals of the transmission lines Z7, Z8 are connected to the second amplifier path terminals 328 of the switching-quad pair 306. The common point between the RF chokes Rfc3, Rfc4 and the transmission lines Z7, Z8 is a point where the RF connections are coupled to the double second amplifier paths.

RF chokes Rfc1, Rfc2 have a low impedance at low frequency (and DC) signals and have a high impedance at the input RF signal 312 frequency. They may be implemented as transmission lines which have a length that is substantially equal to a quarter of the wavelength of the input RF signal 312.

The RF connections comprises a DC isolating element, which may be a capacitor C1, C2. The RF connections may further comprise transmission lines Z3, Z4, Z5, Z6. Each RF connection may be arranged as a series connection of a first transmission line Z3, Z4, a DC isolating element C1, C2 and a second transmission line Z5, Z6.

Figure 1:
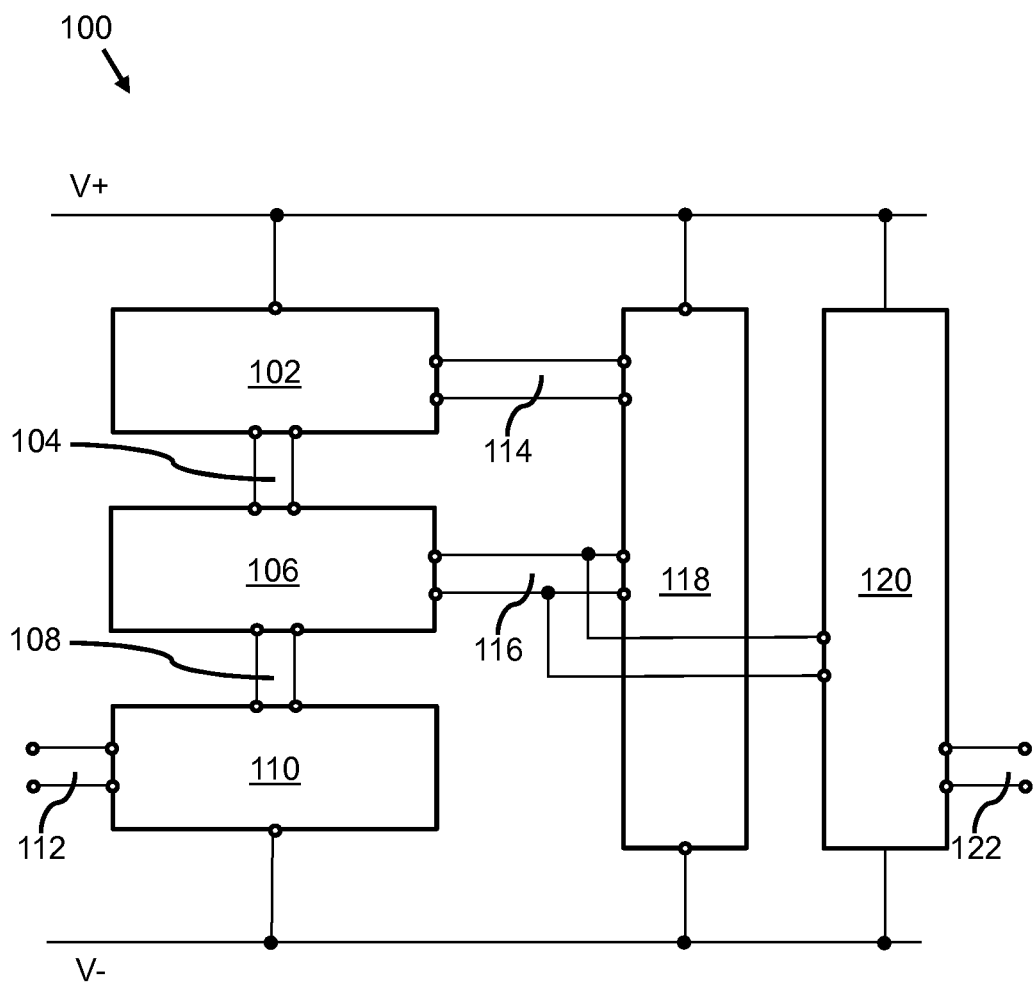
FIG. 1 schematically shows a prior art Dynamic Frequency Divider (DFD) circuit.
Figure 2:
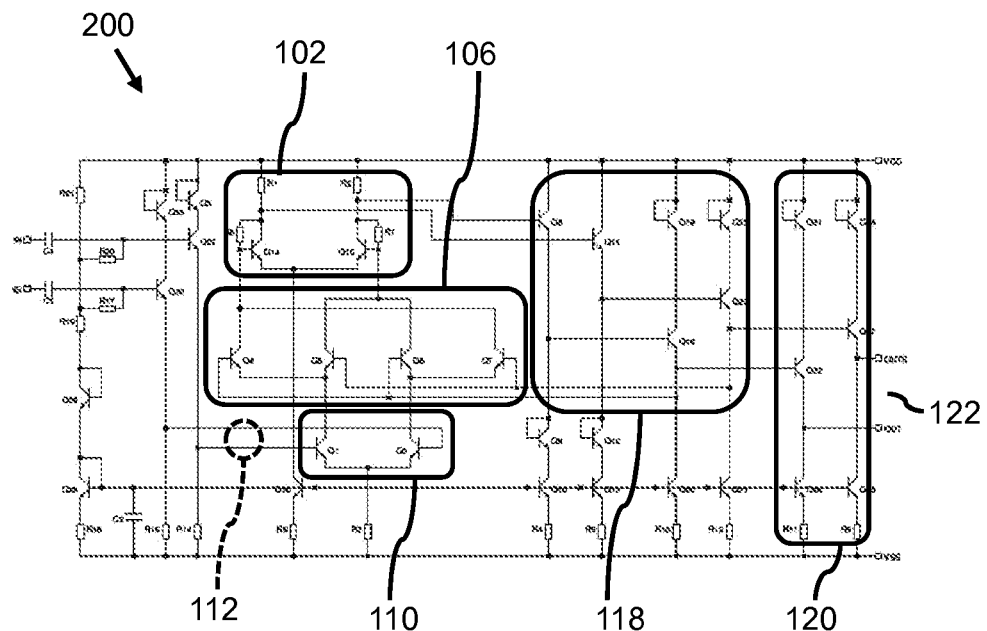
FIG. 2 schematically shows another prior art DFD circuit.

Compared to known dynamic frequency divider circuits 100, 200 of FIG. 1 and FIG. 2, the RF-pair 310 DC path which runs parallel to the DC path of the series arrangement of the switching-quad pair 306 and the transimpedance amplifier 302 provides the RF-pair 310 with more headroom, and also provides the switching-quad pair 306 and the transimpedance amplifier 302 with more headroom. If the headrooms of the sub-circuits are larger (expressed relatively to the DC supply voltage), the DC supply voltage may be reduced in comparison to the DC supply voltage that must be provided to the known dynamic frequency divider circuits. The supply voltage may, for example, be reduced to 3.3 Volts. A lower supply voltage allows the integration of the circuit 300 in low-voltage applications. Furthermore, the power consumption of the circuit is also reduced as the result of the lower supply voltage. Also, because the RF-pair 310 is in an independent DC-path, the operating point of the first amplifier elements A1, A2 of the RF-pair 310 may be optimized independently of the operating points of the second amplifier elements A4, A5, A6, A7 and the transimpedance amplifier 302. Also the operating points of the second amplifier elements A4, A5, A6, A7 and the transimpedance amplifier 302 may be further optimized. Thus, the circuit can better be optimized for higher frequency operations.

The transmission lines Z1, Z2 in the RF-pair 310 DC path together with the transmission lines Z3, Z4 in the RF connections and the transmission lines Z7, Z8 together with the transmission lines Z5, Z6 in the RF connections may be configured such that an output impedance of an amplifier formed by the RF pair matches an input impedance of closed looped mixer consisting of switching quad pair 306, transimpedance amplifier 302 and the double pair of emitter followers 318. If impedance matching is performed between the output impedance of the RF-pair 310 circuitry/first amplifier paths P12, P11 with the input impedance of the closed looped arrangement, higher gain peaking is provided which increases the maximum operating frequency. Further, because of the higher gain peaking, no additional pair of emitter followers is required after the double pair of emitter followers 318 for buffering the divided RF signal 316 at the output of the circuit 300. Such an additional pair of emitter followers was required in the known circuits to provide enough driving power for subsequent circuits. Because of the impedance matching, and, thus, the higher gain peaking, an additional output stage may be omitted.

Figure 4:
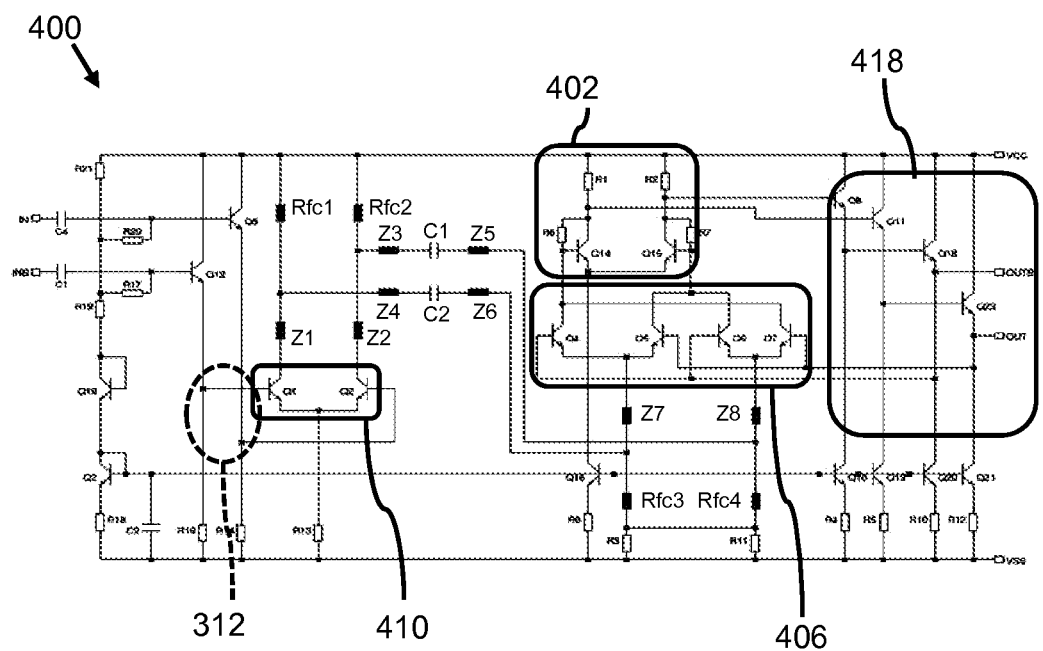

FIG. 4 schematically shows an example of a dynamic frequency divider circuit 400. The shown circuit 400 basically comprises the same element as circuit 300 and elements of circuit 300 are indicated in the circuit 400. The RF input signal 312 is received at the two terminals which are encircled by the dashed line. The transistors Q1 and Q2 form the RF pair 410 which are arranged, respectively, in DC paths formed by R13, Z1, Rfc1 and R13, Z2 and Rfc2. The transistors Q1, Q2 form the first amplifier element A1, A2. Transistors Q1, Q2 form a differential pair of transistors in a common emitter mode configuration. The emitters of Q1 and Q2 are coupled to each other, the bases of the transistors Q1, Q2 are coupled to different components of the RF input signal 312 and their collectors are coupled to different output terminals of the RF pair 410. The switching quad pair 406 is formed by transistors Q4, Q5, Q6, Q7 which form the amplifier elements A4, A5, A6, A7 of the switching-quad amplifier 306 of FIG. 3. The transistors Q4 Q7 form two differential amplifier stages formed by emitter-coupled transistor pairs (Q4/Q5, Q6/Q7) whose outputs are connected (currents summed) with opposite phases. Transimpedance amplifier 402 is formed by transistors Q14, Q16, R1, R2, R6 and R7. The double pair of emitter followers 418 is formed by transistors Q8, Q11, Q18, Q23. Transistors Q8, Q11, Q18, Q23 form a cascade of emitter followers. The transistors Q8, Q11, Q18, Q23 are arranged in an emitter follower mode. The divided RF signal is provided at the terminals OUTB and OUT.

The coupling elements which provide the independent DC-paths to the RF pair 410 and the series arrangement of the quad-switching pair 406 and the transimpedance amplifier 402 are similar elements as in FIG. 3: RF chokes Rfc1, Rfc2, Rfc3, Rfc4. The transmission lines for impedance matching are Z1, Z2, Z3, Z4, Z5, Z6, Z7 and Z8. And the DC isolating elements are formed by the capacitors C1 and C2.

If the circuit 400 of FIG. 4 is implemented on an integrated circuit of a semiconductor device, the capacitors C1 and C2 are formed by mim-capacitors. Mim capacitors are "Metal Insulator Metal" capacitors which are formed by parasitic capacitors between two metal layers of the semiconductor device.

Experiments have shown that the dynamic frequency divider circuit 400 of FIG. 4 operates well at high frequencies, for example 85 GHz. Further, significant deviations of the frequency of the input RF signal frequency (for example 76.5 GHz instead of 85 GHz), significant deviations from the room temperature (125 degrees Celsius) or the use of a different supply voltage (e.g. 3.0 volts instead of 3.3 volts) still result in an adequate functioning of the dynamic frequency divider circuit 400.

The dynamic frequency divider circuit 300, 400 is especially suitable for being operated in the mm-wave band, for example, in between 30 and 300 Ghz. The dynamic frequency divider circuit 300, 400 may be used in a transceiver which operates in the mm-wave band. Such a transceiver is, for example, part of a 77 GHz automotive radar application.

It is noted that the transistors Q1 to Q23 are schematically drawn as npn bipolar transistors. Any other type of transistor which is suitable for use in the circuit 300, 400 of FIG. 3 and FIG. 4 may be used. It will be appreciated that field effect transistors and metal-oxide field effect transistors, such as complementary metal-oxide field effect transistors, can be used as well. The DC supply voltage lines are indicated with V+, V−, Vcc, Vss. These DC supply voltage lines may carry any suitable voltage and that the indications do not suggest a particular voltage for each one of the DC supply voltage lines. The signals referred herein refer to alternating signals with a relatively high frequency. They may be an alternating current signal and/or an alternating voltage signal. Further, a single signal may comprise a single alternating current/voltage or more than one to each other related alternating currents/voltages.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise, the connections may, for example, be direct connections or indirect connections.

The semiconductor substrate described herein can be any semiconductor material or combinations of materials, such as gallium arsenide, silicon germanium, silicon-on-insulator (SOI), silicon, monocrystalline silicon, the like, and combinations of the above.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Although the invention has been described with respect to specific conductivity types or polarity of potentials, skilled artisans appreciated that conductivity types and polarities of potentials may be reversed.

Some of the above embodiments, as applicable, may be implemented using a variety of different signal processing circuits. For example, although FIG. 3 and the discussion thereof describes an exemplary dynamic frequency divider circuit, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of dynamic frequency divider circuit 300 are circuitry located on a single integrated circuit or within a same device. Alternatively, dynamic frequency divider circuit 300 may include any number of separate integrated circuits or separate devices interconnected with each other.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A dynamic frequency divider circuit for operating in a mm-wave band and for dividing an input RF signal to a frequency divided RF signal, the dynamic frequency divider circuit comprising:

an RF pair comprising a differential pair of first amplifier elements and first differential control terminals for receiving the input RF signal, the differential pair comprising first amplifier paths being response to the input RF signal;

a switching-quad pair comprising a double differential pair of second amplifier elements in a cross-coupled arrangement and second differential control terminals for receiving a feedback signal, wherein the double differential pair comprises double second amplifier paths responsive to the feedback signal, and the switching-quad pair comprises differential output terminals connected with the double second amplifier paths;

a transimpedance amplifier coupled in series with the switching-quad pair and configured to amplify the signal of the differential output terminals;

a double pair of emitter followers configured to buffer the amplified signal received from the transimpedance amplifier, wherein the double pair of emitter followers comprises follower input terminals configured to receive the amplified signal from the transimpedance amplifier and further comprising output terminals for providing the feedback signal and the frequency divided RF signal;

DC voltage supply rails;

first coupling elements configured to provide the first amplifier paths with a first DC connection between the DC voltage supply rails;

second coupling elements configured to provide the double second amplifier paths with a second DC connection between the DC voltage supply rails, wherein the second DC connection being parallel to the first DC connection; and RF connections between the first amplifier paths and double second amplifier paths configured to transfer a RF signal from the first amplifier paths to the double second amplifier paths.

2. The dynamic frequency divider circuit according to claim 1, wherein the first coupling elements comprise RF chokes being coupled between the RF pair and a first one of the DC voltage supply rails.

3. The dynamic frequency divider circuit according to claim 2, wherein the first coupling elements comprise transmission lines being coupled between the RF pair and the first one of the DC voltage supply rails.

4. The dynamic frequency divider circuit according to claim 3, wherein
the RF chokes comprise a first terminal and a second terminal,
the transmission lines comprise a first terminal and a second terminal,
the RF chokes are connected with the first terminal to the first one of the DC voltage supply rails, and
the transmission lines are connected with the first terminal to the second terminal of the RF chokes and with the second terminal to the RF pair.

5. The dynamic frequency divider circuit according to claim 2, wherein the RF chokes are transmission lines of a length substantially equal to a quarter wavelength of a fundamental frequency of the input RF signal.

6. The dynamic frequency divider circuit according to claim 1, wherein the second coupling elements comprise RF chokes being coupled between the switching-quad pair and a second one of the DC voltage supply rails.

7. The dynamic frequency divider circuit according to claim 6, wherein the second coupling elements comprise transmission lines being coupled between the switching-quad pair and the second one of the DC voltage supply rails.

8. The dynamic frequency divider circuit according to claim 7, wherein
the RF chokes comprise a first terminal and a second terminal,
the transmission lines comprise a first terminal and a second terminal,
the RF chokes are connected with the first terminal to the second one of the DC voltage supply rails, and
the transmission lines are connected with the first terminal to the second terminal of the RF chokes and with the second terminal to the switching quad pair.

9. The dynamic frequency divider circuit according to claim 8, wherein the RF chokes are transmission lines of a length substantially equal to a quarter wavelength of a fundamental frequency of the input RF signal.

10. The dynamic frequency divider circuit according to claim 1, wherein the RF connections comprise DC isolation elements for isolating a DC voltage of the first amplifier paths from a DC voltage of the double second amplifier paths.

11. The dynamic frequency divider circuit according to claim 10, wherein the DC isolating elements comprise a capacitor.

12. The dynamic frequency divider circuit according to claim 11, wherein the capacitor is a mim capacitor.

13. The dynamic frequency divider circuit according to claim 1, wherein the RF connections comprise transmission lines being coupled between the first amplifier paths and the double second amplifier paths.

14. The dynamic frequency divider circuit according to claim 13, wherein each RF connection comprises two transmission lines coupled in series.

15. The dynamic frequency divider circuit according to claim 14, wherein the DC isolation element of a single RF connection is arranged in between and coupled to the two transmission lines.

16. The dynamic frequency divider circuit according to claim 15, wherein the transmission lines are configured to match an output impedance of an amplifier formed by the RF pair to an input impedance of a closed looped mixer comprising the switching-quad pair, transimpedance amplifier and the double pair of emitter followers.

17. A semiconductor device comprising a dynamic frequency divider circuit for operating in a mm-wave band and for dividing an input RF signal to a frequency divided RF signal, the dynamic frequency divider circuit comprising:

an RF pair comprising a differential pair of first amplifier elements and comprising first differential control terminals for receiving the input RF signal, the differential pair comprising first amplifier paths being response to the input RF signal;

a switching-quad pair comprising a double differential pair of second amplifier elements in a cross-coupled arrangement and comprising second differential control terminals for receiving a feedback signal, the double differential pair comprising double second amplifier paths being responsive to the feedback signal, the switching-quad pair comprising differential output terminals connected with the double second amplifier paths;

a transimpedance amplifier being coupled in series with the switching-quad pair and being configured to amplify the signal of the differential output terminals;

a double pair of emitter followers for buffering the amplified signal received from the transimpedance amplifier, the double pair of emitter followers comprising follower input terminals for receiving the amplified signal from the transimpedance amplifier and comprising output terminals for providing the feedback signal and the frequency divided RF signal;

DC voltage supply rails;

first coupling element for providing the first amplifier paths with a first DC connection between the DC voltage supply rails;

second coupling elements for providing the double second amplifier paths with a second DC connection between the DC voltage supply rails, the second DC connection being parallel to the first DC connection; and RF connections between the first amplifier paths and double second amplifier paths for transferring a RF signal from the first amplifier paths to the double second amplifier paths.

18. A radar system comprising a dynamic frequency divider circuit for operating in a mm-wave band and for dividing an input RF signal to a frequency divided RF signal, the dynamic frequency divider circuit comprising:

an RF pair comprising a differential pair of first amplifier elements and comprising first differential control terminals for receiving the input RF signal, the differential pair comprising first amplifier paths being response to the input RF signal;

a switching-quad pair comprising a double differential pair of second amplifier elements in a cross-coupled arrangement and comprising second differential control terminals for receiving a feedback signal, the double differential pair comprising double second amplifier paths being responsive to the feedback signal, the switching-quad pair comprising differential output terminals connected with the double second amplifier paths;

a transimpedance amplifier being coupled in series with the switching-quad pair and being configured to amplify the signal of the differential output terminals;

a double pair of emitter followers for buffering the amplified signal received from the transimpedance amplifier, the double pair of emitter followers comprising follower input terminals for receiving the amplified signal from the transimpedance amplifier and comprising output terminals for providing the feedback signal and the frequency divided RF signal;

DC voltage supply rails;

first coupling element for providing the first amplifier paths with a first DC connection between the DC voltage supply rails;

second coupling elements for providing the double second amplifier paths with a second DC connection between the DC voltage supply rails, the second DC connection being parallel to the first DC connection; and RF connections between the first amplifier paths and double second amplifier paths for transferring a RF signal from the first amplifier paths to the double second amplifier paths.

\* \* \* \* \*